United States Patent
Taussig et al.

(10) Patent No.: US 7,139,183 B2
(45) Date of Patent: Nov. 21, 2006

(54) LOGICAL ARRANGEMENT OF MEMORY ARRAYS

(75) Inventors: Carl Philip Taussig, Redwood City, CA (US); Richard E. Elder, Palo Alto, CA (US); Hao Luo, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 81 days.

(21) Appl. No.: 10/896,163

(22) Filed: Jul. 21, 2004

(65) Prior Publication Data
US 2006/0018143 A1    Jan. 26, 2006

(51) Int. Cl.
*G11C 5/14*    (2006.01)
(52) U.S. Cl. .......................... 365/51; 365/63
(58) Field of Classification Search ................ 365/51, 365/63, 72, 226, 230.03
See application file for complete search history.

(56) References Cited

U.S. PATENT DOCUMENTS

| | | | | |
|---|---|---|---|---|
| 5,040,152 A | * | 8/1991 | Voss et al. | 365/230.03 |
| 5,847,576 A | * | 12/1998 | Mastrocola et al. | 365/230.03 |
| 5,856,947 A | * | 1/1999 | Fang | 365/189.01 |
| 6,134,178 A | * | 10/2000 | Yamazaki et al. | 365/233 |
| 6,478,231 B1 | | 11/2002 | Taussig | |
| 6,738,307 B1 | | 5/2004 | Eaton, Jr. et al. | |
| 6,754,124 B1 | * | 6/2004 | Seyyedy et al. | 365/214 |
| 6,781,918 B1 | * | 8/2004 | Eaton et al. | 365/230.06 |
| 6,845,056 B1 | * | 1/2005 | Kinoshita | 365/230.03 |

\* cited by examiner

*Primary Examiner*—Tan T. Nguyen (57) ABSTRACT

An aspect of the present invention is a logical arrangement of memory arrays. The logical arrangement includes a plurality of memory arrays deposed in a row-column configuration, a controller coupled to the plurality of memory arrays and at least one power line, at least one sense line and at least one address line coupled to the controller wherein a number of connections from the controller to the at least one power line, the at least one sense line and the at least one address line is minimized.

14 Claims, 6 Drawing Sheets

LOGICAL ARRANGEMENT OF MEMORY ARRAYS

FIELD OF THE INVENTION

The present invention relates generally to the field of semiconductor memory devices and more particularly to a logical arrangement of memory arrays.

BACKGROUND OF THE INVENTION

In the semiconductor processing industry, there is currently a strong trend toward scaling down existing structures and fabricating smaller structures. This process is commonly referred to as microfabrication. One area in which microfabrication has had a significant impact is in the microelectronic area. In particular, the scaling down of microelectronic structures has generally allowed the structures to be less expensive, have higher performance, exhibit reduced power consumption, and contain more components for a given dimension. Although microfabrication has been widely active in the electronics industry, it has also been applied to other applications such as biotechnology, optics, mechanical systems, sensing devices and reactors.

Microfabrication can be utilized to fabricate permanent inexpensive rugged memory (PIRM) arrays. PIRM is an extremely low cost archival solid-state memory for digital photography, digital audio and other applications. From a fabrication perspective, PIRM includes a series of semiconductor and other thin-films sandwiched between a patterned top metal layer and a patterned bottom metal layer. Where these metal layers cross forms a two-port device.

A PIRM configuration typically includes a plurality of layers whereby each layer includes a large number of memory arrays thereon. There are several reasons why it is desirable to have a large number of memory arrays on each layer of PIRM configuration. One advantage is that for a fixed minimum feature size, the larger number of arrays on each layer, the smaller each array will be. Smaller arrays consume less power since not all of the arrays need to be powered at all times. Furthermore, smaller arrays have a smaller capacitance which translates to a higher speed of operation.

Another advantage of having a large number of arrays on each layer has to do with defect management. In order for the PIRM array to obtain the low cost, the array must be tolerant of manufacturing defects. By subdividing each PIRM layer into a large number of arrays, feasible defect management strategies are facilitated whereby the amount of memory lost to an un-repairable manufacturing defect is minimized.

However, the problem with subdividing each PIRM layer into a large number of smaller arrays is the large number of connections that are required. If independent connections are made from a controller chip to each array then the number of connections needed is roughly proportional to the number of arrays. This is because the addressing has logarithmic efficiency and it takes nearly the same number of address lines regardless of the size of the array.

For example, if a 1.7 GB PIRM is divided into 12800 arrays each with independent connections to the controller chip, 371,000 connections are required. If the same 1.7 GB PIRM is divided into 128 arrays with independent connections to the controller chip, 4480 address lines are required. Neither of these examples is feasible. Not only are the number of connections to the controller die prohibitive, but layer-to-layer interconnect density and overhead routing are also unacceptably high.

Accordingly, what is needed is PIRM architecture that does not suffer from the above-delineated drawbacks of the PIRM manufacturing process. The architecture should be simple, inexpensive and capable of being easily adapted to existing technology. The present invention addresses these needs.

SUMMARY OF THE INVENTION

An aspect of the present invention is a logical arrangement of memory arrays. The logical arrangement includes a plurality of memory arrays deposed in a row-column configuration, a controller coupled to the plurality of memory arrays and at least one power line, at least one sense line and at least one address line coupled to the controller wherein a number of connections from the controller to the at least one power line, the at least one sense line and the at least one address line is minimized.

Other aspects and advantages of the present invention will become apparent from the following detailed description, taken in conjunction with the accompanying drawings, illustrating by way of example the principles of the invention.

DETAILED DESCRIPTION

The present invention relates to a logical arrangement of memory arrays. The following description is presented to enable one of ordinary skill in the art to make and use the invention and is provided in the context of a patent application and its requirements. Various modifications to the embodiments and the generic principles and features described herein will be readily apparent to those skilled in the art. Thus, the present invention is not intended to be limited to the embodiment shown but is to be accorded the widest scope consistent with the principles and features described herein.

As shown in the drawings for purposes of illustration, a logical arrangement of memory arrays is disclosed. Varying embodiments incorporate a scalable methodology for interconnecting large numbers of arrays with a modest number of interconnections to a controller chip while avoiding high power consumption, large regions of reverse biased diodes and diminished selectivity due to leakage currents from large number of unselected elements. The methodology exploits the asymmetry that is introduced in the memory circuit by using single sided sensing and employing a combination of horizontal, vertical and diagonal striping of the address, power and sense lines in order to decouple the system.

The observation that facilitates the disclosed embodiments is that not all of the arrays in the logical arrangement need to be simultaneously connected to the controller chip. Since not all of the arrays in the logical arrangement need to be simultaneously connected to the controller chip it is possible to intermittently make certain arrays inactive. Accordingly, although not all connections need to be removed to make an array inactive, certain combinations should be avoided.

Figure 1:
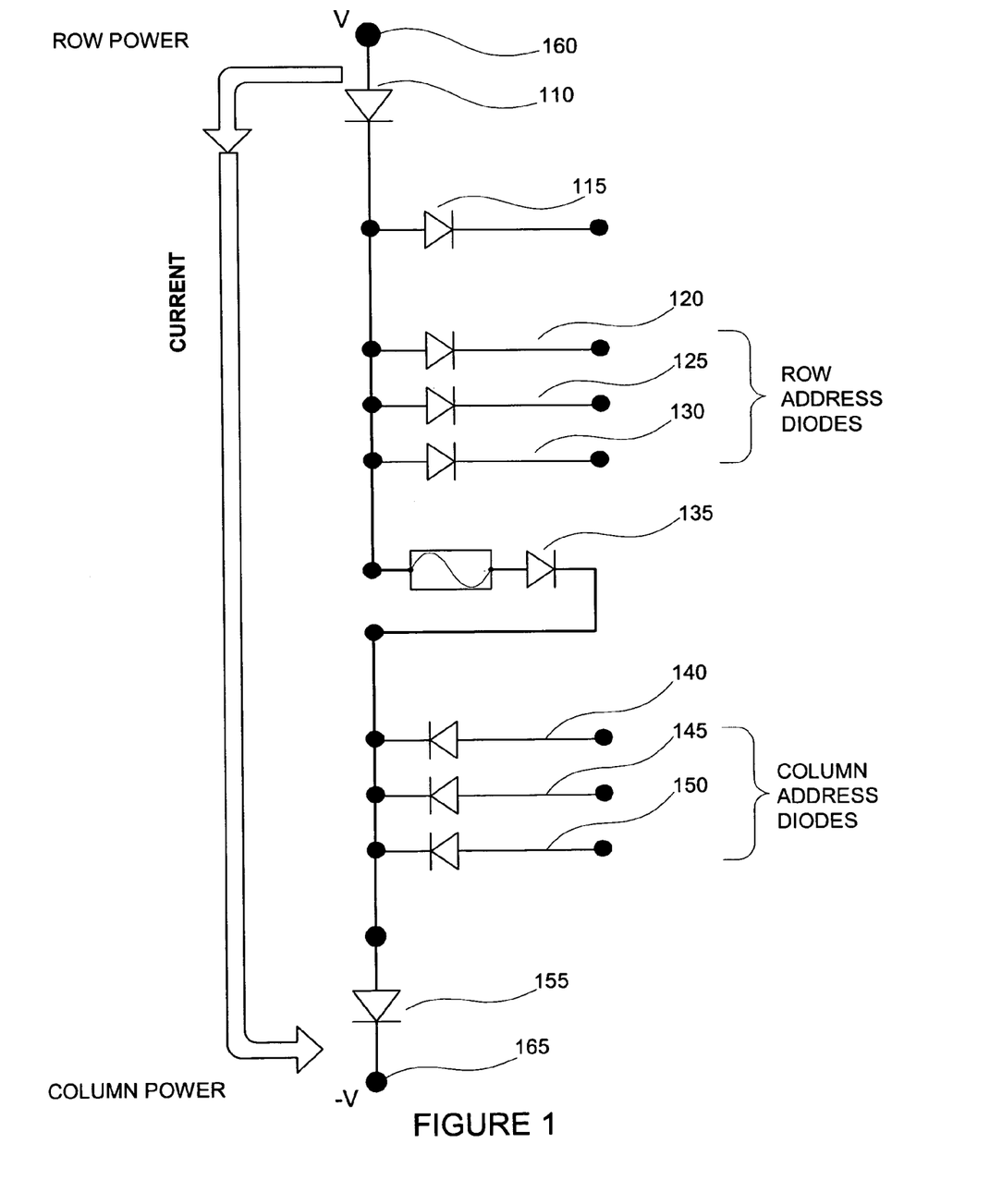
FIG. 1 shows a schematic illustration of the power dissipation that results from voltages applied to row and column power supplies while other lines are disconnected.

FIG. 1 shows a schematic illustration of the power dissipation that results from voltages applied to row and column power supplies while other lines are disconnected. FIG. 1 shows a pull-up diode 110, a row sense/write inhibit diode 115, row address diodes 120, 125, 130, a memory element 135, column address diodes 140, 145, 150 and a pull-down diode 155. The current is shown in FIG. 1 flowing from the row power supply 160 to the column power supply 165. This configuration forward biases the entire memory array and results in large power dissipation.

Figure 2:
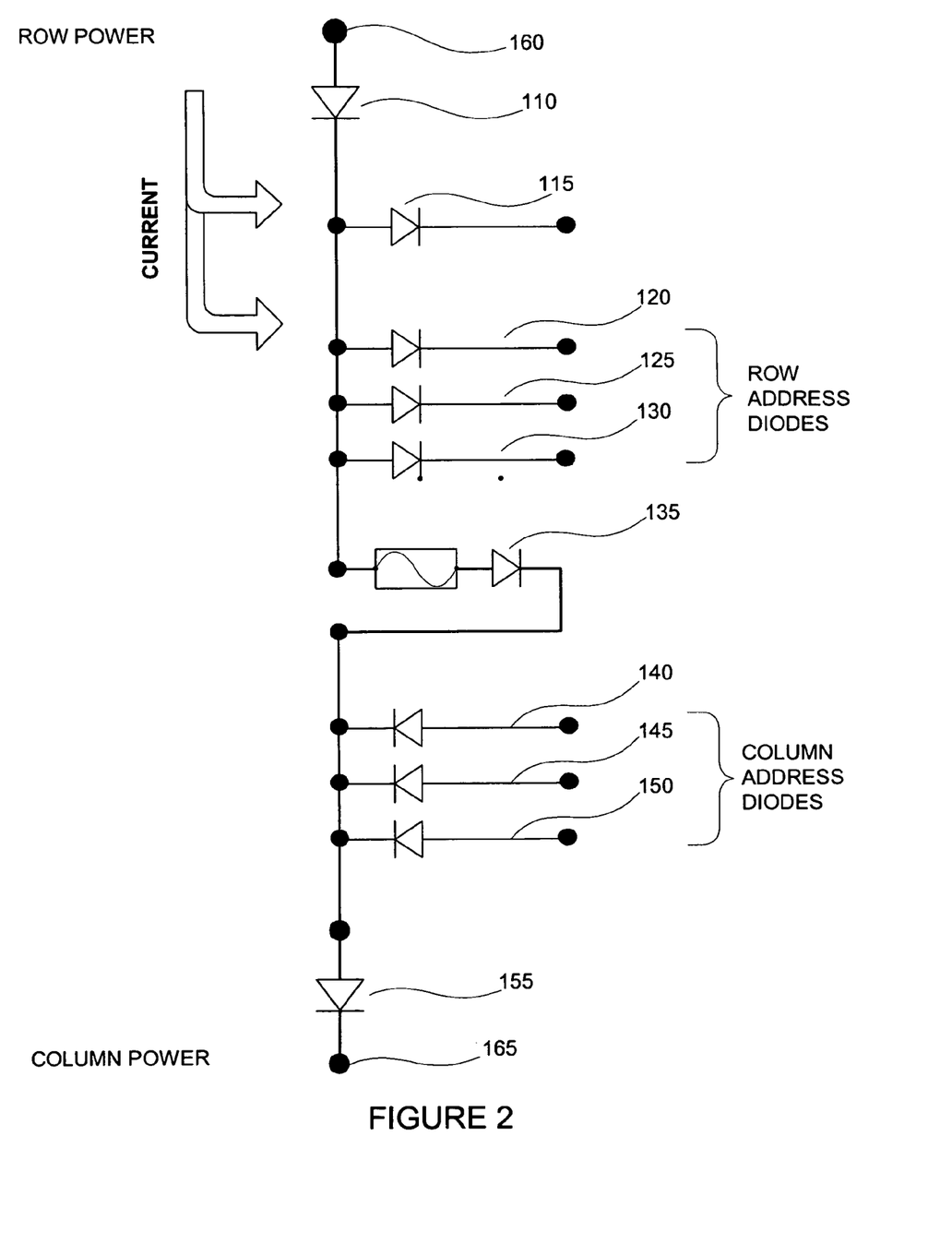
FIG. 2 shows a schematic illustration of the situation where a positive voltage is applied to row power and the sense and row address lines are forward biased and all other lines are disconnected.

FIG. 2 shows a schematic illustration of the situation where a positive voltage is applied to the row power supply and voltages are applied to the row address and sense lines such that those diodes are forward biased In this situation, currents do not flow through the memory array but power is still dissipated in the address logic. Although not pictured on FIG. 2 an analogous situation exists with the column address and column power lines. Additionally, in this situation large currents are placed on the sense lines that can swamp out the signal from an active array connected to the same sense line.

Figure 3:
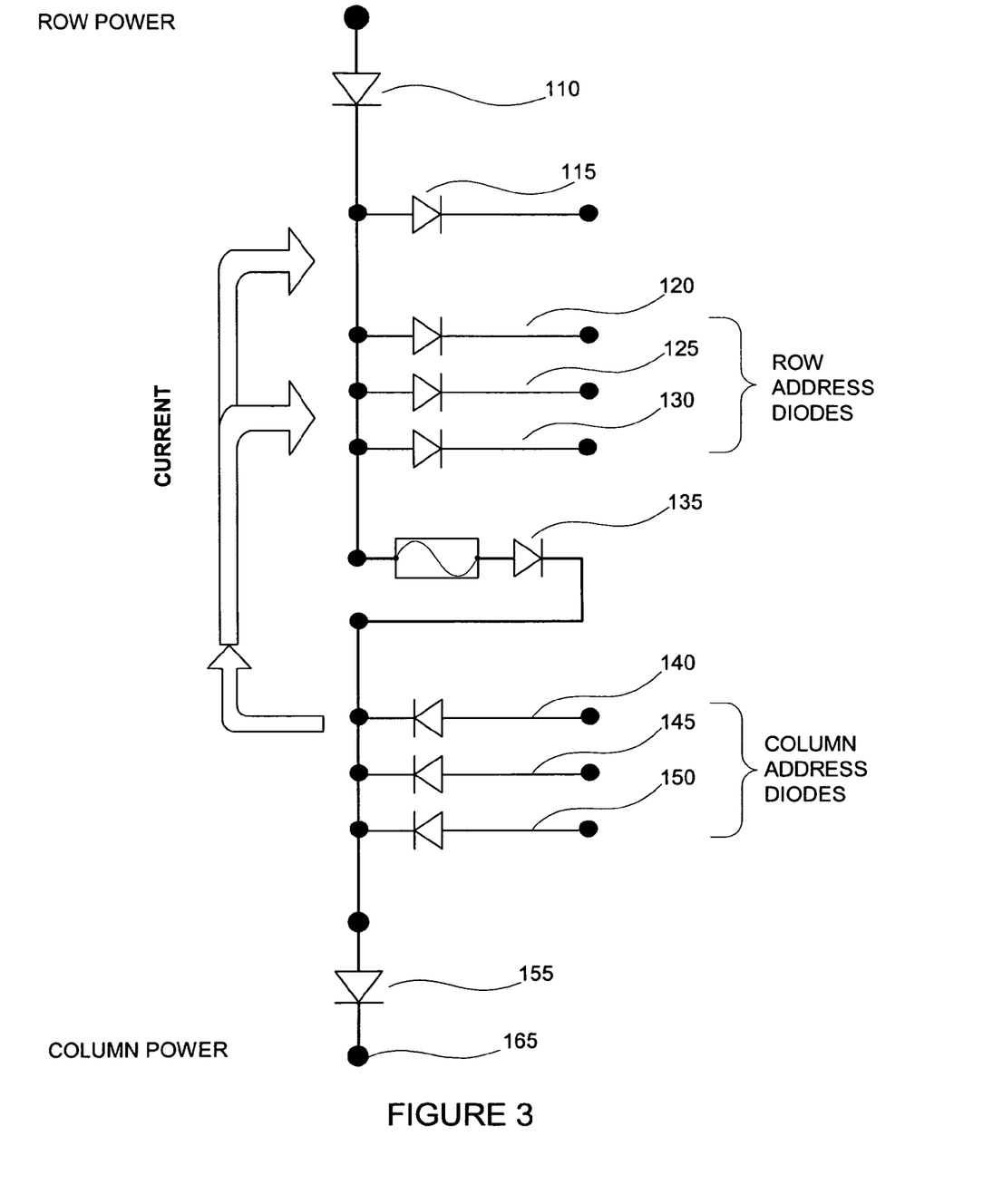
FIG. 3 shows a schematic illustration of the situation where a negative voltage is applied to the row address and sense lines and a positive voltage is applied to the column address lines, and all other lines are disconnected.

FIG. 3 shows a schematic illustration of the situation where the row address and sense lines are powered as well as the column address lines. In this case, the entire memory array is reverse biased. Although this situation is not as severe as the other cases, it may still result in excessive power consumption if the rectification of the diodes is insufficient. Additionally, the leakage current drawn through the sense diodes may degrade signals from an active array attached to the same sense line.

The number of connections to each array in the logical arrangement can be divided by function in decreasing quantity: address lines, power lines and sense lines. Therefore an important objective of the interconnect strategy is to use the fewest sets of address lines or alternatively to connect the most arrays to each address bus without creating any of the undesirable interconnection situations described in FIGS. 1–3.

In the following description, it is assumed that there are "K" memory arrays in a "super array". These memory arrays are arranged in "R" super array columns and "Q" super array rows. Row address buses and sense lines are routed together because both have the same undesirable interactions with other power and address lines. Accordingly, if a bad situation is avoided for one, it is avoided for the other as well.

There is one row address bus and one sense line for each row in the super array for a total of Q row address buses and sense lines wherein each row address bus and sense line is connected to R arrays. Similarly there are Q column address buses each connected to R arrays. In the case of the column address buses, every Qth array column is connected to the same column address bus.

With regard to power lines, there is one row power line for each super-array column and there are the same number of column power supply lines. Each column power line is connected to the memory arrays along a diagonal or the like such that each column power line connects to one memory array in each super array row and no two memory arrays connected to a column power line share the same column address bus.

Figure 4:
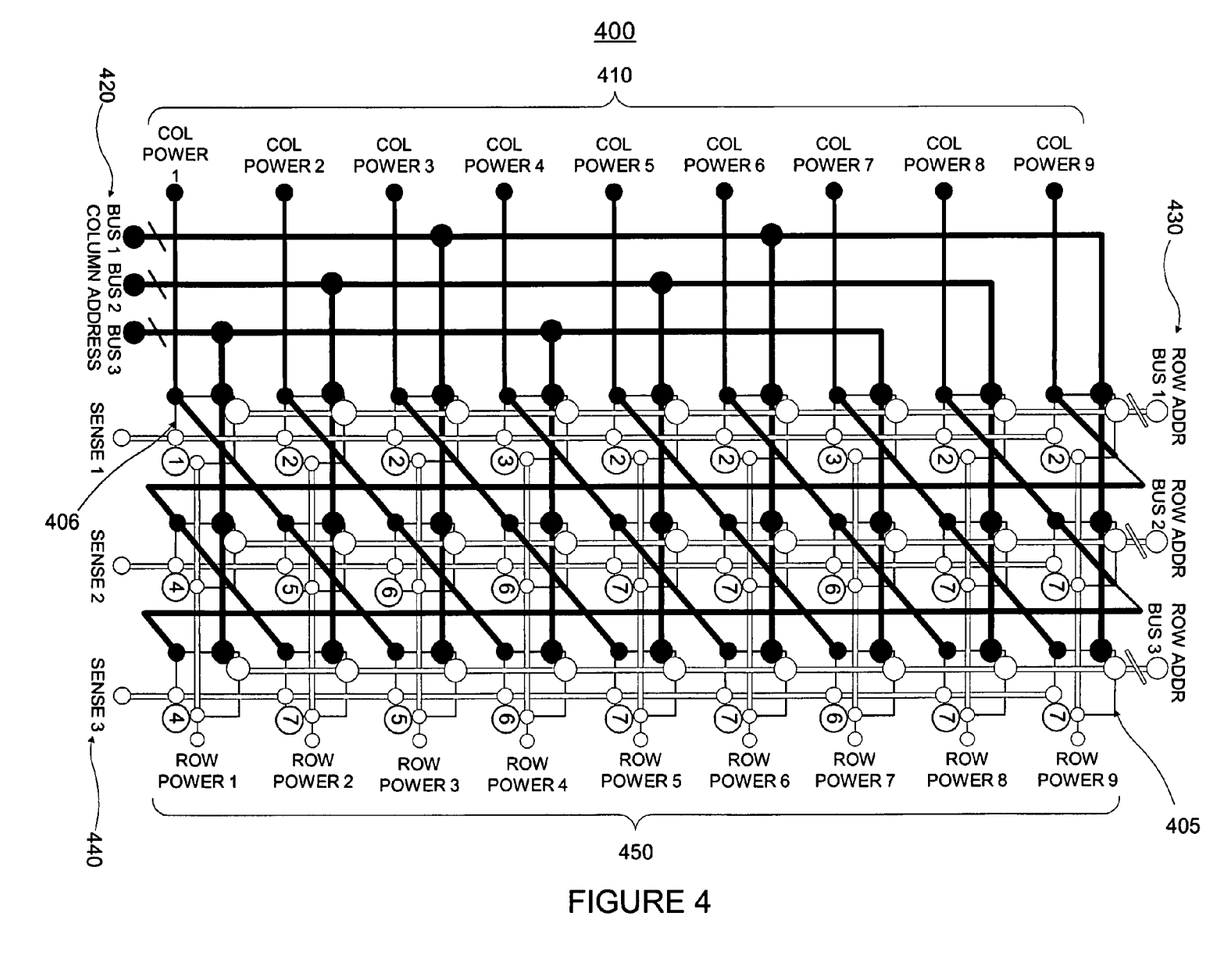
FIG. 4 shows a logical arrangement of memory arrays according to an embodiment of the present invention.

FIG. 4 shows a logical arrangement 400 of memory arrays according to an embodiment. The arrangement 400 is basically a rectangular "super array" that includes memory arrays 405, column power lines 410, column address buses 420, row address buses 430, sense lines 440 and row power lines 450. The super array depicted on FIG. 4 has Q=3, and R=9, so it has 3 super-array rows and 9 super array columns for a total of 27 arrays in the super array. In general for the minimum number of interconnections to the controller chip, the number of rows and columns is not equal although the arrangement works if the number or rows and columns is equal.

It should be noted that FIG. 4 represents the logical arrangement of the arrays. Any physical arrangement of the arrays that provides the same interconnections between the arrays is feasible.

The "super array" is be divided into regions denoted 1–7 in FIG. 4. The regions are divided based on the interconnections that are shared by arrays in that region with another array with activated power, sense and address lines. This array is referred to as the active array. Accordingly, the arrays in the other regions can be examined to determine whether any undesirable interconnection situations are present. This analysis is done as if the super array contains only one active array.

It can be shown that all of the memory arrays in a super array column can be simultaneously activated without creating unwanted connections in the inactive arrays. The choice of how many memory arrays to activate in the super array is based on a trade-off between increasing the data transfer rate and increasing the power consumption.

Referring back to FIG. 4, array 406 is the active array and is labeled as region 1. The other labeled regions share common power, sense, or address lines with the active array with the exception of the region 7 which has no common address, power or sense lines with the active array. Each memory array 405 is assigned to regions 1–7 based on the interconnections thereof.

Figure 5:
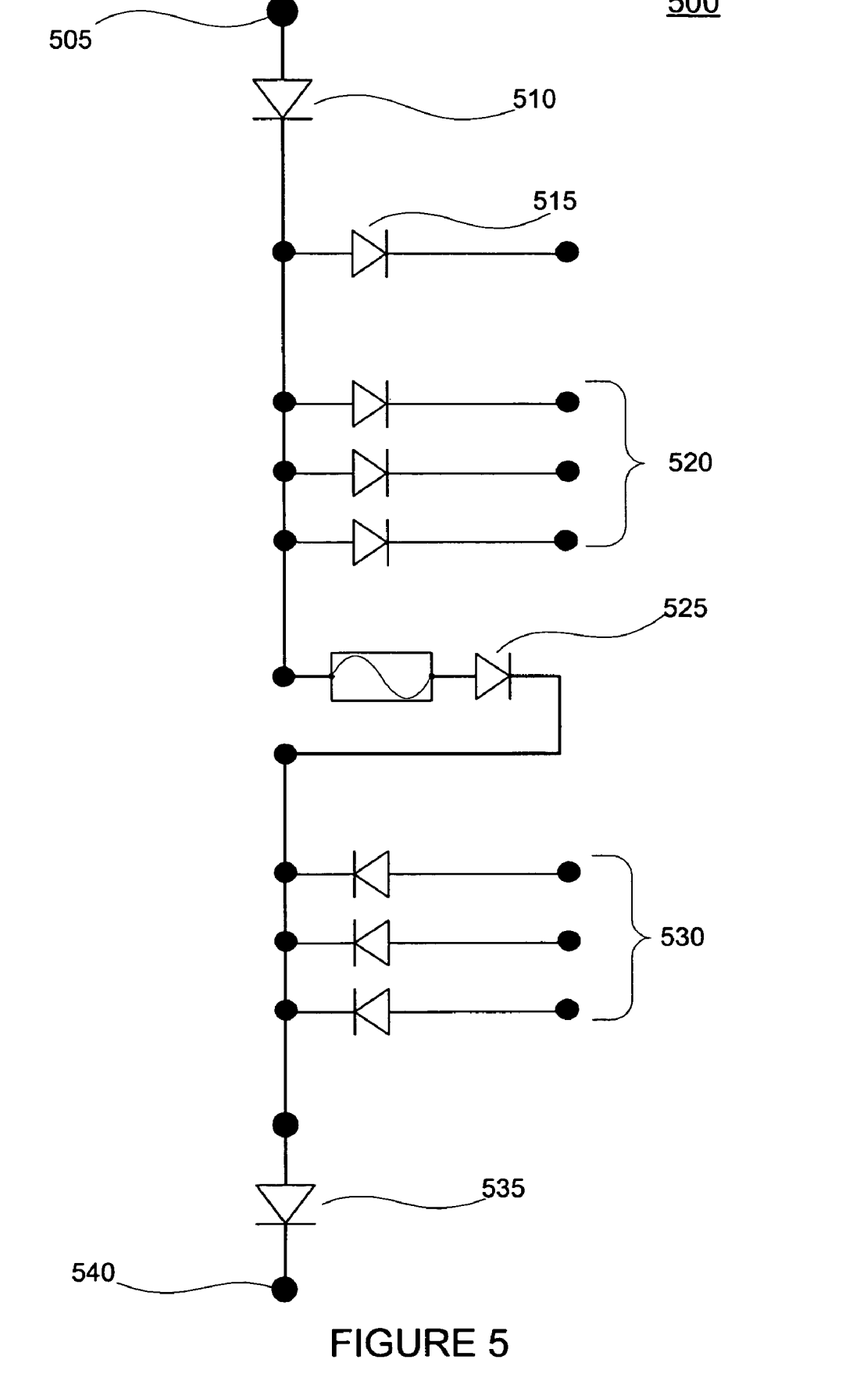
FIG. 5 shows a schematic illustration of a configuration of each region in the super array in accordance with an embodiment of the present invention.

For analytical purposes, FIG. 5 shows a schematic illustration of a configuration 500 of each region in the super array. The configuration 500 includes a row power source 505, a pull-up diode 510, a row sense/write inhibit diode 515, row-address diodes 520, a memory element 525, column address diodes 530, a pull-down diode 535 and a column power source 540.

Referring to FIG. 4, the largest percentage of the memory arrays in the super array share no direct connections with the active array and belong to region 7. The row power and column address diodes are held at voltage $(-V-\Delta V)$ where $-V$ is the voltage applied to the column power lines of the active array, V is the voltage applied to the row power lines of the active array, and $\Delta V$ is the diode turn-on voltage. The sense, row address and column power are held at voltage V+ΔV. The power, address and sense diodes are all reverse biased in the arrays in region 7. Fortunately, the total number of these diodes is a very small fraction of the number of diodes so the overall leakage current is small.

Again referring to FIG. 4, assume region 1 is the active array and the associated voltages are:
Row power=V
Row sense~0
Row address=−V−ΔV
Column address=V+ΔV
Column power=−V In this array, the memory elements are reversed biased and the address diodes are forward biased in active stripes. This can result in large leakage current if the array size is large or if the rectification of the diodes is small or if there are a significant number of shorted memory cell diodes.

The largest source of dissipation in the active array results from the forward bias currents in the address and power diodes needed to deselect all but the row and column of the addressed memory cell. This power can be reduced at the cost of additional connections to the controller chip by power line striping. In power line striping, the row (col) pull-up (down) diodes are divided into groups. Power is only supplied to a single group at a time the others being left disconnected. This minimizes the power dissipated in the pull-up and address diodes in the unselected power stripes at the expense of adding more connections to the controller.

Memory arrays in region 2 share only the sense and row address lines with the active array and the associated voltages are:
Row power=−V−ΔV
Row sense~0
Row address=−V−ΔV
Column address=−V−ΔV
Column power=V+ΔV In this region, the column power diodes are all reversed biased wherein the number of arrays in region 2 is equal to R−R/Q.

Memory arrays in region 3 share row address, column address and sense lines with the active array and the associated voltages are:
Row power=−V−ΔV
Row sense~0
Row address=−V−ΔV
Column address=V+ΔV
Column power=V+ΔV All of the memory cell diodes in the region are reverse biased and the number of arrays in region 3 is R/Q −1.

Memory arrays in region 4 share row power and column address lines with the active array and the associated voltages are:
Row power=V
Row sense=V+ΔV
Row address=V+ΔV
Column address=V+ΔV
Column power=V+ΔV The row power diodes in this region are reverse biased and the number of arrays in region 4 is Q−1.

Memory arrays in region 5 share only the column power lines with the active array and the associated voltages are:
Row power=−V−ΔV
Row sense=V+ΔV
Row address=V+ΔV
Column address=−V−ΔV
Column power=−V The row address and sense diodes in this region are reverse biased and the number of arrays in region 5 is Q−1.

Memory arrays in region 6 share only the column address lines with the active array and the associated voltages are:
Row power=−V−ΔV
Row sense=V+ΔV
Row address=V+ΔV
Column address=V+ΔV
Column power=V+ΔV The row power diodes in this region are reverse biased and the number of arrays in region 6 is (R/Q−1)*(Q−1).

Accordingly, there are no arrays in the super-array, other than the active array, that have power dissipation resulting from forward biased currents through the address sense or power lines. There are a fraction of arrays that have reverse biased currents, however the power dissipated in these arrays can be tolerated.

The above-described analysis assumes that specific voltages are applied to the address, sense and power supply lines of the inactive arrays. However, less power is consumed if the controller places the lines in a high impedance state. In that case, the voltages applied to the inactive lines approaches the asserted values through leakage from the interconnected arrays but are lessened in magnitude by the resistance of the elements that the voltage passes through.

In a PIRM memory system in accordance with an embodiment, multiple layers of "super arrays" are stacked whereby one layer contains the controller. The power and address lines of the layers are all connected together, while the sense lines from each super array are separately connected to the controller. In the actual physical layout a super array may be spread across several layers or there may be multiple super arrays on a single layer.

Figure 6:
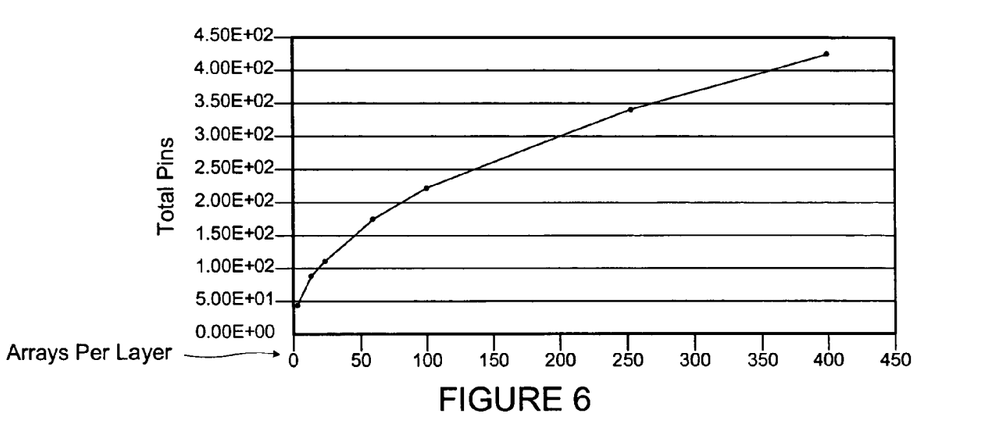
FIG. 6 shows a graphical representation of the total number of pins vs. the number of arrays per super array.

For a fixed total memory size, number of super arrays and number of memory arrays within each super array, the row and column dimensions of the super array can be selected to minimize the total number of connections to the memory controller. The total number of connections to the controller is equal to the sum of the sense lines from each super array and the total number of power and address lines on a single super array. Accordingly, the equation for the total number of connections, T, to the controller is:

$$T=2R+NQ+2QM$$

where
R=number of super array columns
N=number of super arrays
Q=number of super array rows
M=number of row or column address lines per memory array As an example, consider a PIRM design for a 1.7 GB memory that includes 32 super arrays. The row and column connections can be calculated by taking the derivative of the equation for the total connections with respect to the number of super array rows. FIG. 6 shows a graphical representation of these calculations as the total number of connections to the controller vs. the number arrays per super array.

Figure 7:
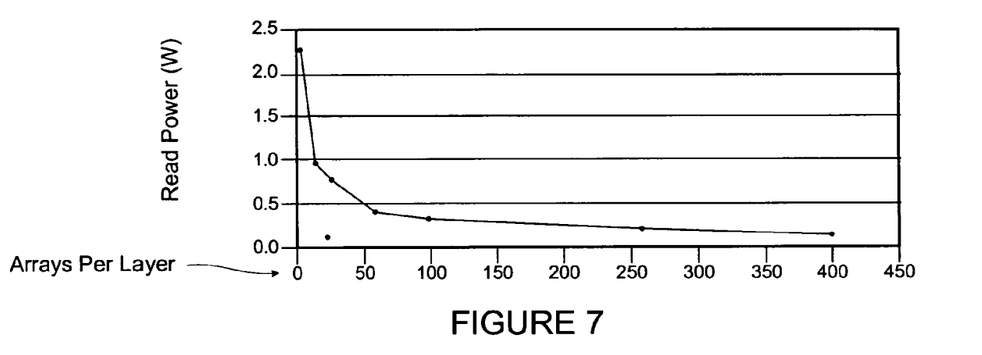
FIG. 7 shows a graphical representation of the read power vs. the number of arrays per super array.
Figure 8:
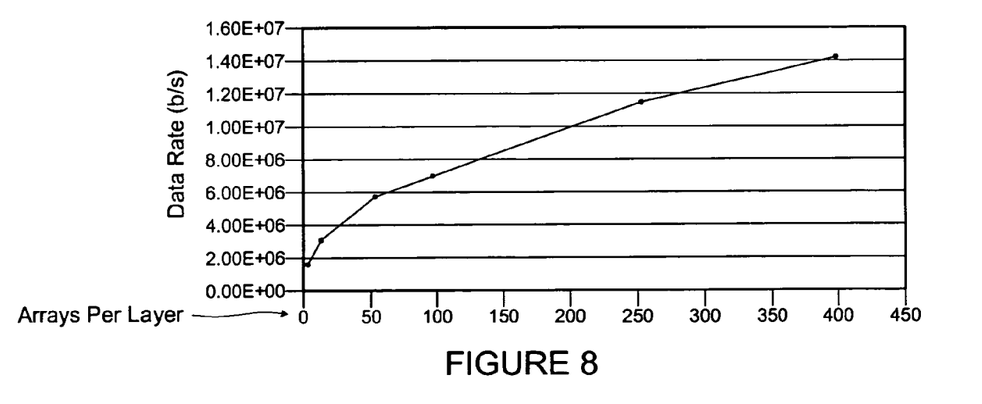
FIG. 8 shows a graphical representation of the data transfer rate vs. the number of arrays per super array.

Additionally, FIGS. 7 and 8 are respective graphical representations of the read power vs. the number of arrays per super array and the data transfer rate vs. the number of arrays per super array. In order to provide these graphical representations, the following parameters were utilized:
Row power supply read voltage=3V
Column power supply read voltage=−3V
Diode turn on voltage=1.2V
Diode series resistance=5.5 Mega-Ohm Diode rectification ratio at +/− read voltages=$1e^5$
Capacitance per diode=$1e^{-16}$ F Varying embodiments of the present invention incorporate a scalable methodology for interconnecting large numbers of arrays with a modest number of interconnections to the controller chip while avoiding high power consumption, large regions of reverse biased diodes and diminished selectivity due to leakage currents from large number of unselected elements. The methodology exploits the asymmetry that is introduced in the memory circuit by using single sided sensing and employing a combination of horizontal, vertical and diagonal striping of the address, power and sense lines in order to decouple the system.

As a result, the number of connections to the controller chip are greatly reduced for any number of memory arrays and reverse biased currents are eliminated in the non-active memory arrays which leads to lower power consumption. Furthermore, the ability to connect a large number of arrays for a fixed number of controller connections minimizes the impact when an array is lost due to manufacturing defect. Additionally, smaller memory arrays lead to reduced capacitance and higher speed operation as well as a better signal to noise ratio since there are fewer parallel sense diodes.

Without further analysis, the foregoing so fully reveals the gist of the present invention that others can, by applying current knowledge, readily adapt it for various applications without omitting features that, from the standpoint of prior art, fairly constitute essential characteristics of the generic or specific aspects of this invention. Therefore, such applications should and are intended to be comprehended within the meaning and range of equivalents of the following claims. Although this invention has been described in terms of certain embodiments, other embodiments that are apparent to those of ordinary skill in the art are also within the scope of this invention, as defined in the claims that follow.

What is claimed:

1. A logical arrangement of memory arrays comprising:
   a plurality of memory arrays deposed in a row-column configuration;
   a controller coupled to the plurality of memory arrays;
   at least one power line wherein the at least one power line includes a column power line, and a row power line, at least one sense line and at least one address line coupled to the controller; and
   at least one column address bus wherein each column power line is connected to at least one of the plurality of memory arrays such that each column power line connects to one memory array in each row of the row-column configuration wherein no two memory arrays connected to a column power line share a column address bus.

2. The arrangement of claim 1 wherein the at least one power line includes a column address line and a row address line.

3. The arrangement of claim 1 wherein each memory array includes a memory element and at least one diode.

4. The arrangement of claim 1 wherein the at least one sense line is associated with a row in the row-column configuration.

5. A memory system comprising:
   a plurality of stacked memory layers wherein at least one of the plurality of memory layers includes a controller wherein each of the plurality of memory layers includes a plurality of memory arrays deposed in a row-column configuration coupled to the controller;
   at least one power line including a column power line and a row power line, at least one sense line and at least one address line coupled to the controller; and
   at least one column address bus wherein each column power line is connected to at least one of the plurality of memory arrays such that each column power-line connects to one memory array in each row of the row-column configuration wherein no two memory arrays connected to a column power line share a column address bus.

6. The memory system of claim 5 wherein the at least one address line includes a column address line and a row address line.

7. The memory system of claim 5 wherein each memory array includes a memory element and at least one diode.

8. The memory system of claim 5 wherein the at least one sense line is associated with a row in the row-column configuration.

9. The memory system of claim 5 wherein the number of memory arrays equals a number of columns in the row-column configuration multiplied by the number of rows in the row-column configuration multiplied by the number of superarrays.

10. The memory system of claim 9 wherein the total number of connections in the memory system comprises the following relationship:

$$\frac{2K}{Q} + Q(N + 2M)$$

wherein K is the number of arrays in a superarray, Q is the number of rows, N is the number of superarrays and M is a number of row or column address lines per memory array.

11. A logical arrangement of memory arrays comprising:
    a plurality of memory arrays deposed in a row-column configuration wherein each memory array includes a memory element and at least one diode;
    a controller coupled to the plurality of memory arrays;
    at least one power line coupled to the controller wherein the at least one power line includes a column power line and a row power line;
    at least one sense line coupled to the controller wherein the at least one sense line is associated with a row in the row-column configuration;
    at least one address line coupled to the controller wherein the at least one address line includes a column address line and a row address line; and
    at least one column address bus wherein each column power line is connected to at least one of the plurality of memory arrays such that each column power line connects to one memory array in each row of the row-column configuration wherein no two memory arrays connected to a column power line share a column address bus.

12. A memory system comprising:
    a plurality of stacked memory layers wherein at least one of the plurality of memory layers includes a controller wherein each of the plurality of memory layers includes
    a plurality of memory arrays deposed in a row-column configuration wherein each memory array includes a memory element and at least one diode;
    a controller coupled to the plurality of memory arrays;

at least one power line coupled to the controller wherein the at least one power line includes a column power line and a row power line;

at least one sense line coupled to the controller wherein the at least one sense line is associated with a row in the row-column configuration;

at least one address line coupled to the controller wherein the at least one address line includes a column address line and a row address line; and at least one column address bus wherein each column power line is connected to at least one of the plurality of memory arrays such that each column power line connects to one memory array in each row of the row-column configuration wherein no two memory arrays connected to a column power line share a column address bus.

13. The memory system of claim 12 wherein the number of memory arrays equals a number of columns in the row-column configuration multiplied by the number of rows in the row-column configuration multiplied by the number of superarrays.

14. The memory system of claim 13 wherein the total number of connections in the memory system comprises the following relationship:

$$\frac{2K}{Q} + Q(N + 2M)$$

wherein K is the number of arrays in a superarray, Q is the number of rows, N is the number of superarrays and M is a number of row or column address lines per memory array.

* * * * *